United States Patent
Tang et al.

(10) Patent No.: US 8,305,125 B2
(45) Date of Patent: *Nov. 6, 2012

(54) LOW LATENCY SYNCHRONIZER CIRCUIT

(75) Inventors: Bo Tang, Cupertino, CA (US); Edgardo F. Klass, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 76 days.

This patent is subject to a terminal disclaimer.

(21) Appl. No.: 12/904,340

(22) Filed: Oct. 14, 2010

(65) Prior Publication Data
US 2011/0025394 A1    Feb. 3, 2011

Related U.S. Application Data

(63) Continuation of application No. 12/497,027, filed on Jul. 2, 2009, now Pat. No. 7,843,244.

(51) Int. Cl.
*H03K 3/289* (2006.01)
(52) U.S. Cl. ........................... 327/202; 327/203
(58) Field of Classification Search ............ 327/202, 327/203, 211, 212, 214, 218
See application file for complete search history.

(56) References Cited

U.S. PATENT DOCUMENTS

| | | | |
|---|---|---|---|
| 5,418,407 | A | 5/1995 | Frenkil |
| 5,864,252 | A | 1/1999 | Tran |
| 6,242,957 | B1 | 6/2001 | Uemura |
| 6,492,855 | B1 * | 12/2002 | Pasqualini ............... 327/211 |
| 6,642,763 | B2 | 11/2003 | Dike |
| 6,724,846 | B1 | 4/2004 | Lo |
| 7,501,871 | B2 * | 3/2009 | Sanduleanu et al. ........ 327/218 |
| 7,649,393 | B2 * | 1/2010 | Maeda ..................... 327/198 |
| 7,843,244 | B1 * | 11/2010 | Tang et al. ............... 327/202 |

* cited by examiner

*Primary Examiner* — Hai L Nguyen
(74) *Attorney, Agent, or Firm* — Meyertons, Hood, Kivlin, Kowert & Goetzel, P.C.; B. Noel Kivlin; Stephen J. Curran

(57) ABSTRACT

A synchronizer circuit includes a master stage and a slave stage. The master stage may include a first master latch coupled to receive a data input signal, and a clock signal. The master stage may also include a second master latch coupled to receive the data input signal, and a delayed version of the clock signal. The master stage may further include a pull-up circuit that may drive an output line of the master stage depending upon an output of each of the first master latch and the second master latch. The slave stage may include a slave latch having an input coupled to the output line of the master stage. The slave stage may provide an output data signal that corresponds to the captured input data signal and is synchronized to the receiving clock signal.

24 Claims, 4 Drawing Sheets

LOW LATENCY SYNCHRONIZER CIRCUIT

This application is a continuation of U.S patent application Ser. No. 12/497,027, entitled "Low Latency Synchronizer Ciruit," filed Jul. 2, 2009, now U.S. Pat. No. 7,843,244, issued on Nov. 30, 2010.

BACKGROUND OF THE INVENTION

1. Field of the Invention

This invention relates to integrated circuits and, more particularly, to synchronizer circuits.

2. Description of the Related Art

In an electronic circuit such as a flip-flop, for example, metastability can occur when a signal that is in transition is sampled. In other words, if a signal at the input of a flip-flop is not stable when the clock signal edge is received, then the setup and hold time of the flip-flop has been violated. When this occurs, the output state may be uncertain before finally settling to a stable state. However, neither the output state nor the settling time of the flip-flop can be guaranteed to be correct. This metastability may occur in circuits that use one clock signal to send a signal and a different clock signal to receive the signal (e.g., signals that cross clock domains). To avoid or at least reduce the probability of metastability occurring, circuit designers frequently use circuits referred to as synchronizers. A common synchronizer may include two or more series connected flip-flops which are clocked by the same clock signal. The second or third flip-flop in the synchronizer provides a valid signal that is synchronized to the receiver clock domain.

Although synchronizers are commonly used, they may have drawbacks. One such drawback in using multiple flip-flop synchronizers is signal latency. There can be several full clock cycles of delay in receiving stable data. In some timing critical circuits, this delay may be unacceptable.

SUMMARY

Various embodiments of a synchronizer circuit are disclosed. In one embodiment, an integrated circuit may include a synchronizer circuit configured to capture an input data signal using a clock signal that may be asynchronous to the input data signal. For example, a circuit having a first clock signal may send source synchronous data to a second circuit. The second circuit may capture the data using a synchronizer circuit. The synchronizer circuit may include a master stage and a slave stage. The master stage may include a first master latch having a first data input coupled to receive the data input signal, and a first clock input coupled to receive the clock signal. The master stage may also include a second master latch having a second data input coupled to receive the data input signal, and a second clock input coupled to receive a delayed version of the clock signal. The master stage may further include a pull-up circuit that may be configured to drive an output line of the master stage depending upon an output of each of the first master latch and the second master latch. The slave stage may include a slave latch having an input coupled to the output line of the master stage. The slave stage may be configured to provide an output data signal that corresponds to the captured input data signal and is synchronized to the receiving clock signal.

Figure 1:
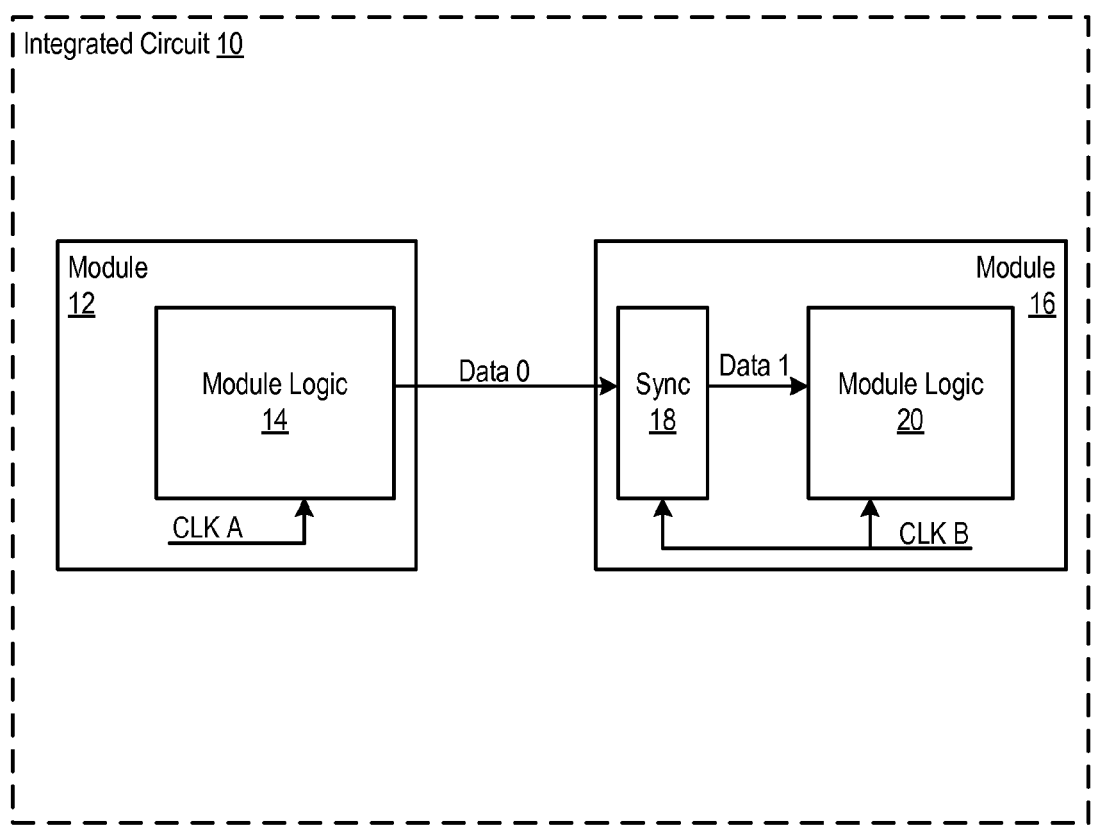
FIG. 1 is a block diagram of an integrated circuit including one embodiment of a synchronizer circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Turning now to FIG. 1, a block diagram of an integrated circuit including one embodiment of a synchronizer circuit is shown. The integrated circuit 10 includes a circuit module 12, and a circuit module 16. The module 12 includes module logic block 14, and the module 16 includes a module logic block 20 coupled to a synchronizer 18. Module logic 14 is coupled to a clock signal designated as CLK A, and the synchronizer 18 and the module logic 20 are both coupled to a clock signal designated as CLK B.

It is noted that module logic blocks 14 and 16 may be representative of any type of circuit that may be found on an integrated circuit. For example, integrated circuit 10 may be representative of a system on a chip (SOC). As such, module logic 14 may be any clocked circuit that provides a data signal. In one embodiment, module logic 14 may as simple as a flip-flop that is clocked by CLK A, or as complex as a multi-million-gate circuit with combinatorial as well as sequential logic. Module logic 20 may also be any clocked circuit that receives a data signal. Similar to module logic 14, module logic 20 may be as simple as a flip-flop that is clocked by CLK B, or as complex as multi-million gate circuit with combinatorial as well as sequential logic.

Regardless of the complexity or overall function of the module logic, as shown, module logic 14 is clocked by CLK A and module logic 16 is clocked by CLK B. Accordingly, module logic 14 and module logic 20 are said to be in different clock domains. Thus, as described above, if CLK A and CLK B are not in-phase, then the data 0 signal being provided by module logic 14 is asynchronous with respect to CLK B. As further described above, this may present problems when trying to capture the data using CLK B. More particularly, there is a chance that the data 0 signal may be captured during a transition, thereby causing a conventional logic circuit such as a flip-flop to become metastable.

To reduce the probability of capturing the data 0 signal during a transition and thus, causing a metastable condition, synchronizer 18 may be configured to capture the data 0 signal using a slave latch and pair of master latches, with one master latch using a delayed version of the clocking signal. In addition, once the data signal is accurately captured, the data signal may now be synchronous with the receiving logic clock (e.g., CLK B). As described further below, in one embodiment, synchronizer 18 may be referred to as a low latency synchronizer since it may capture the data 0 signal in one master/slave stage.

Figure 2:
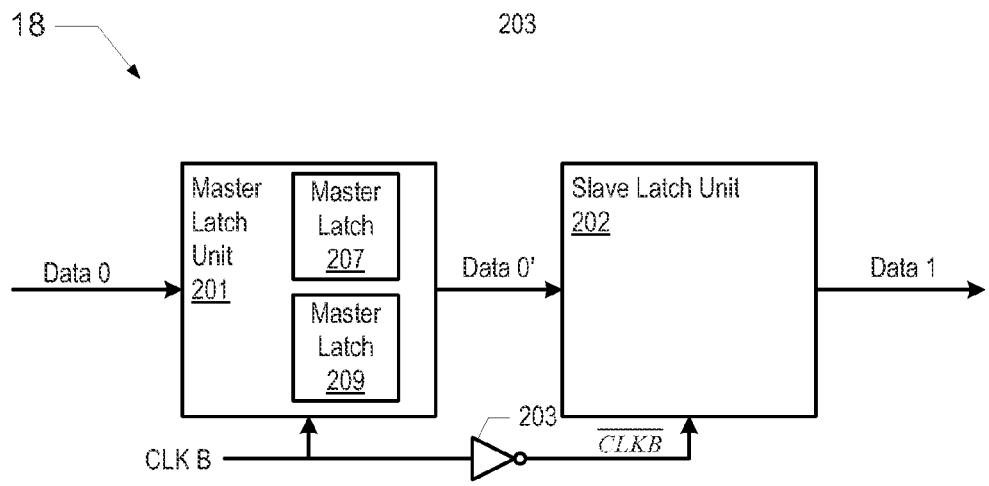
FIG. 2 is a block diagram of one embodiment of a master/slave synchronizer circuit.

Referring to FIG. 2, a block diagram of one embodiment of a master/slave synchronizer circuit 18 is shown. Synchronizer 18 includes a master latch unit 201 and a slave latch unit 202. The master latch unit 201 is coupled to receive a data signal (e.g., data 0) and to provide a corresponding data signal (e.g. data 0') to slave latch unit 202, which provides a corresponding output data signal (e.g., data 1).

As shown, the master latch unit 201 includes a pair of latches designated master latch 207 and master latch 209. The master latch unit 201 is clocked by CLK B, and the slave latch unit 202 is clocked by an inverted version of CLK B (e.g., $\overline{CLKB}$), which is inverted by inverter 203. As described in greater detail below, during normal operation, the master latch unit 201 may act as a transparent latch and may pass through the incoming data signal during the time that the CLK B signal is at a low logic level. During that time, the output signal may change with the input signal. When the CLK B signal transitions to a high logic level, the data value is captured and the output is now stable. The slave latch unit 202 may pass the output of the master latch unit 201 on the falling edge of the $\overline{CLKB}$ signal, and on the rising edge of the $\overline{CLKB}$ signal the slave latch 202 captures and outputs the data 1 signal. It is noted that that above embodiment describes positive edge triggered operation. However, in other embodiments, negative edge triggered operation may be implemented.

Figure 3:
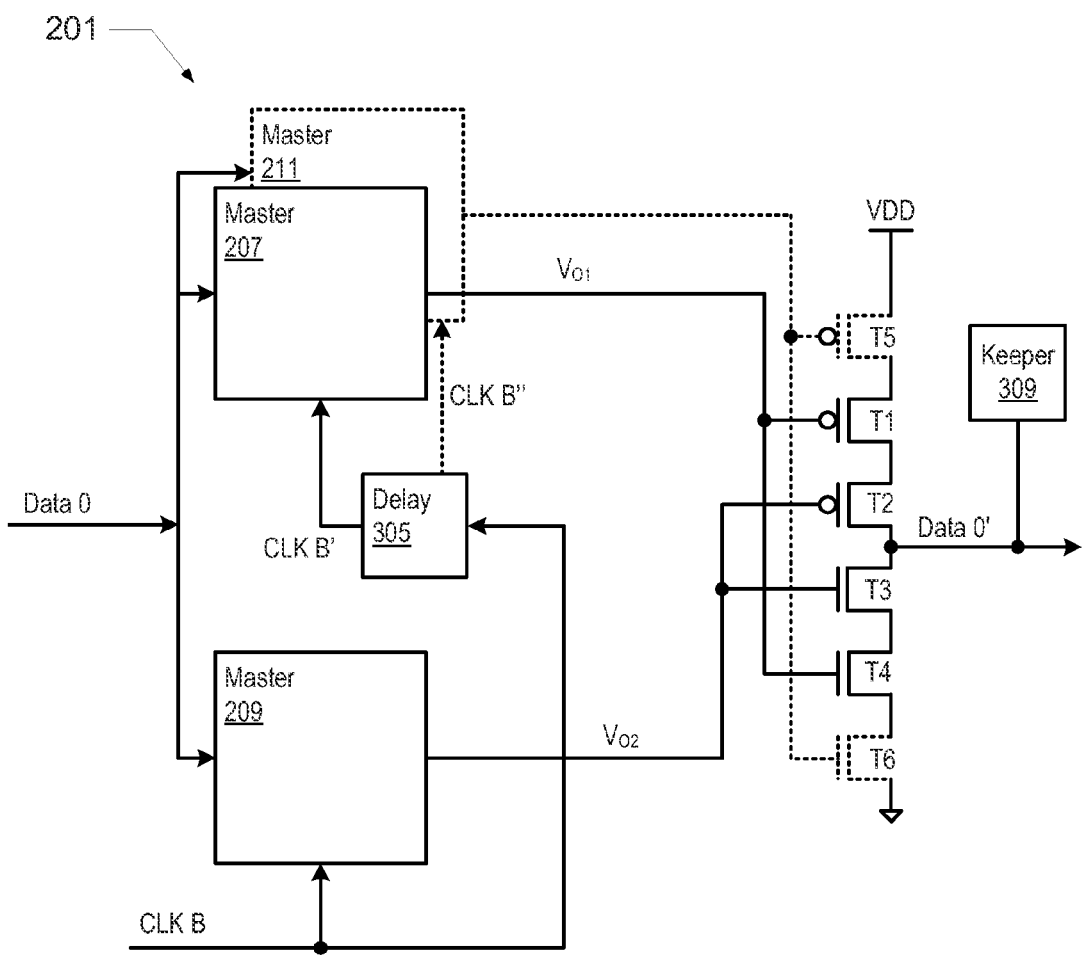
FIG. 3 is a circuit diagram illustrating additional aspects of an embodiment of the master latch of the synchronizer circuit depicted in FIG. 1 and FIG. 2.

In FIG. 3, a circuit diagram illustrating additional aspects of an embodiment of the master latch of the synchronizer circuit depicted in FIG. 1 and FIG. 2 is shown. The master latch unit 201 includes a pair of master latches (e.g., master latch 207, and master latch 209) that are coupled to a transistor pull-up stack. As shown, the transistor pull-up stack includes four transistors, designated T1 through T4 (T1 and T2 (2 PMOS), and T3 and T4 (2 NMOS)) coupled serially (source to drain or vice versa) between VDD and a circuit ground reference node. The VDD node is coupled to the transistor T1, which is coupled to the transistor T2, which is coupled to the transistor T3, which is coupled to the transistor T4, which is in turn coupled to the circuit ground node. A node between transistors T2 and T3 is the output of the transistor pull-up stack, and is designated as data 0'. The output node is also coupled to a keeper circuit 309. The output of master latch 207 (e.g., $V_{O1}$) is coupled to the gate terminals of transistors T1 and T4, which form, for example, a CMOS inverter. Similarly, the output of master latch 209 (e.g., $V_{O2}$) is coupled to the gate terminals of transistors T2 and T3, which also form an inverter.

In the illustrated embodiment, both master latches 207 and 209 are coupled to receive the incoming data signal (e.g., data 0). In the illustrated embodiment, master latch 209 is clocked by the CLK B signal. However, the master latch 207 is clocked by a delayed version of CLK B, which is designated as CLK B'. In one embodiment, the delay circuit 305 may be implemented using a delay line, or some number of logic gates to create the desired clock delay. In various embodiments, the delay may be selected dependent on various factors. For example, the delay may be selected dependent on (e.g., slightly longer than) the slew rate of the input data signal. The delay may also be dependent on the frequency of the input data signal, and particularly the relationship between the frequency of the input data signal and the frequency of the capture clock. It is noted that other dependencies and selection factors may be used.

During operation, in one embodiment, upon a falling edge of CLK B, master latch 209 allows the data 0 signal to propagate through to $V_{O2}$ and on the rising edge of CLK B, the data 0 signal is captured. Likewise, upon a falling edge of CLK B', master latch 207 allows the data 0 signal to propagate through to $V_{O1}$, and on the rising edge of CLK B', the data 0 signal is captured. If both latches capture a valid data signal (i.e., data is stable, and not in transition), then if the data is a logic value of one, transistors T3 and T4 will turn on and transistors T1 and T2 will turn off, thereby pulling the output node down to or near the circuit ground reference. Alternatively, if the data signal is a logic value of zero, transistors T3 and T4 will turn off and transistors T1 and T2 will turn on, thereby pulling the output node up to or near VDD. The keeper circuit 309 retains the output data 0' value.

In one embodiment, the keeper circuit 309 may be implemented as a cross-coupled inverter circuit, although other implementations are possible. The keeper circuit 309 may hold the data 0' value at the output node in the event that one of the master latches settles to the wrong (opposite) value after being in a metastable state, since that would cause the transistor pull-up stack to effectively be placed in a high impedance state prior to the slave latch 202 capturing the value.

Figure 4:
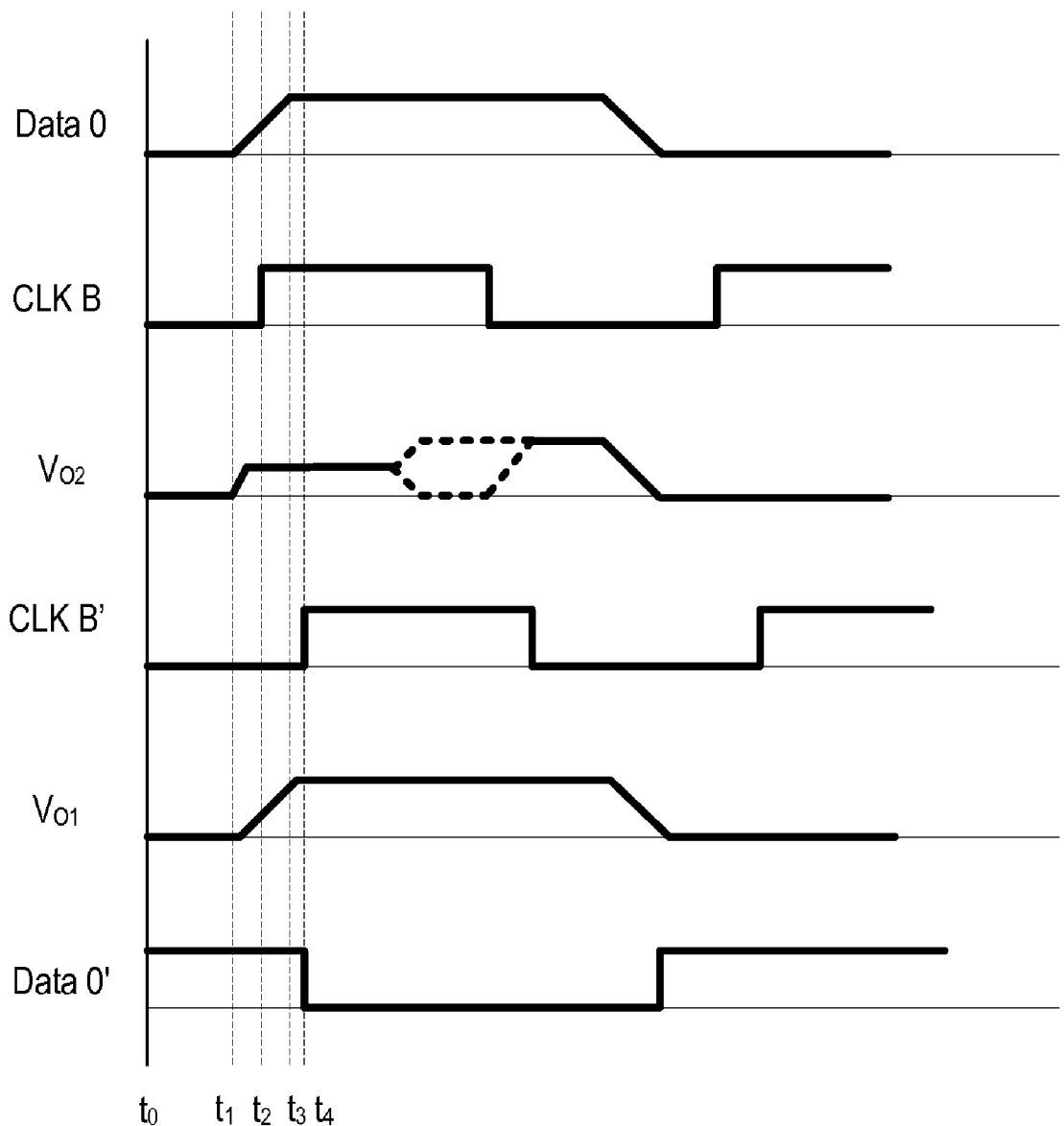
FIG. 4 is a timing diagram illustrating some exemplary waveforms of the embodiment of the synchronizer circuit of FIG. 3.

In the event that the data 0 signal is in transition when either master latch 207 or master latch 209 captures, the latch that captures the transitioning data may go into metastable operation, and its output may be uncertain for some indeterminate period of time before settling (shown in FIG. 4). However, since the clock signal is delayed to master latch 207, the likelihood of both master latches capturing data 0 during transition is reduced.

The circuit operation is described by way of example. If data 0 is in transition when master latch 209 captures, and the output $V_{O2}$ is metastable, then transistors T2 and T3 will be partially conducting and thus act like resistive devices. However, if master latch 207 captures after the data 0 has transitioned and is now stable, the output $V_{O1}$ will be stable, and assuming captured value is a logic value of one, transistor T1 will be off and transistor T4 will turn on. In this state, since transistor T1 is off, the state of transistor T2 is irrelevant. However, since transistor T4 is conducting and transistor T3 is in a resistive state, the output node between transistors T2 and T3 is still pulled down to or near the circuit ground reference, albeit through a resistive path (e.g., T3). In a similar way, if the output $V_{O1}$ is metastable and the output $V_{O2}$ is stable at a logic level of one, then transistors T1 and T4 will be partially conducting, while transistor T2 will be off, and transistor T3 will be on. Thus, the output node between transistors T2 and T3 will still be pulled down to or near the circuit ground reference through a resistive path (e.g., T4). Conversely, if the captured data input is a logic level of zero, then the PMOS transistors will be the transistors to conduct and the NMOS transistor will be cut off to provide a logic level of one at the output node.

Accordingly, if either master latch is metastable, the transistor pull-up stack will provide an output from the other master latch. Thus, delaying the clock signal to one of the master latches reduces the probability of both master latches going into a metastable state at the same time.

To further reduce the probability of capturing an input data signal during a transition, and thus causing metastability, rather than using two master latches (e.g., master 207, and 209), in another embodiment, multiple master latches (e.g., Master 207,209,211) may be used. In such an embodiment, any number of master latches may be coupled to receive the input data signal in parallel. Other than a first master latch, each master latch may be clocked with a clock signal having a different delay (e.g., CLKD' and CLKB"). In addition, the transistor pull-up stack may include a complimentary pair of transistors for each master latch (e.g., T5 and T6). Accordingly, the probability that at least one master latch has captured a stable input data signal is increased.

Turning to FIG. 4, a timing diagram illustrating some exemplary waveforms of the embodiment of the synchronizer circuit of FIG. 3 is shown. The timing diagram includes six waveforms which correspond to the signals described above in FIG. 1 through FIG. 3. Accordingly, the waveforms of FIG. 4 are designated as Data 0, CLK B, $V_{O1}$, CLK B' $V_{O1}$, and Data 0'.

At time t1, the data 0 signal begins transitioning from a logic value of zero to a logic value of one. The transition completes at time t3. However, at time t2, a rising edge of the CLK B signal occurs to close master latch 209, and master latch 209 captures the transitioning data 0 signal before it completely closes. Accordingly, the master latch 209 goes into a metastable state as indicated by the dashed lines in the output $V_{O2}$, which is between a logic value of zero and one. As described above, this output may cause transistors T2 and T3 to be partially conducting.

In contrast, at time t4 a rising edge of the CLK B' signal occurs, thereby capturing the data 0 signal. However, since the CLK B' signal was delayed, the data 0 signal is now stable before master latch 207 closes. Thus, the output $V_{O1}$, of master latch 207 is stable, and as shown transitions from a logic zero to a logic one value. As described above, this causes transistor T1 to cut off and transistor T4 to conduct, thereby causing a logic value of zero to appear at the output node data 0'. This value may then be captured by the slave latch 202 of FIG. 2 and output as the data 1 signal which is now synchronized to the CLK B signal. It is noted that the waveforms are exemplary, and are intended for discussion purposes only. Thus, various delays associated with the logic are not necessarily shown, or are not necessarily to scale.

It is noted that although the embodiments are shown and described above as being implemented on a single integrated circuit, it is contemplated that the sending and receiving circuits may be on separate integrated circuits. It is further noted that in one embodiment, integrated circuit 10 may be a processor chip, a communication chip, a controller, or the like. One such embodiment is shown in FIG. 5.

Figure 5:
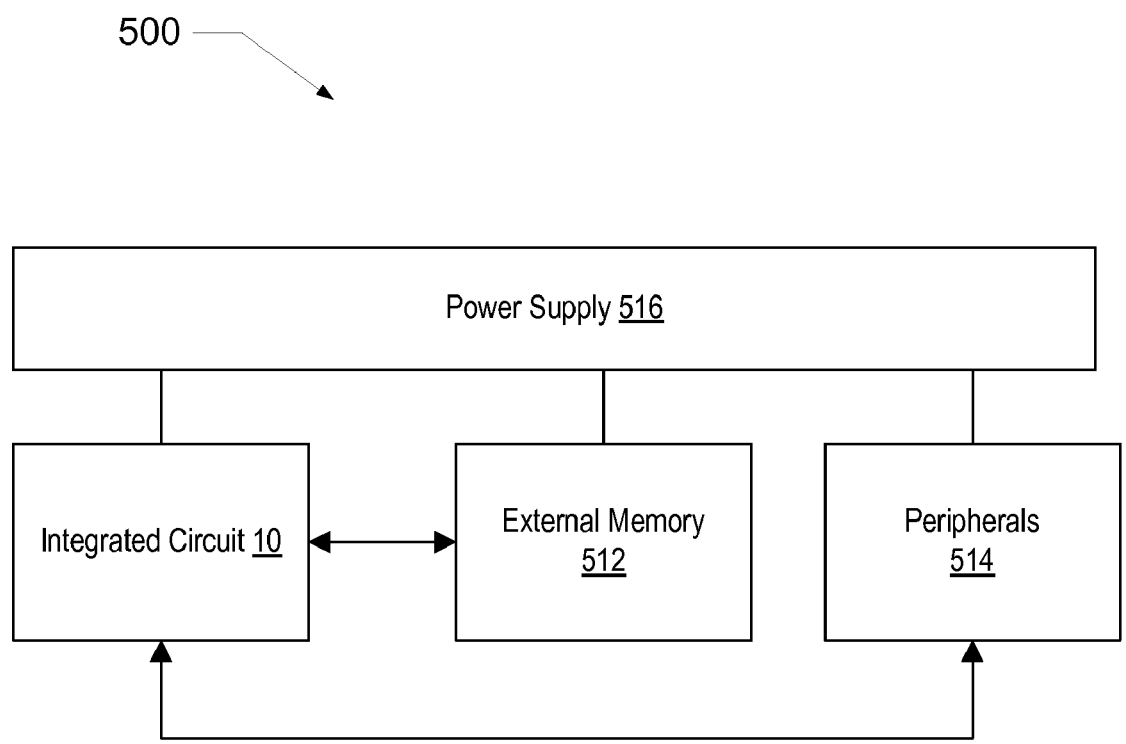
FIG. 5 is a block diagram of one embodiment of a system including the integrated circuit shown in FIG. 1

Turning to FIG. 5, a block diagram of one embodiment of a system 500 including the integrated circuit 10 is shown. The system 500 includes at least one instance of the integrated circuit 10 of FIG. 1 coupled to one or more peripherals 514 and an external memory 512. The system 500 also includes a power supply 516 that may provide one or more supply voltages to the integrated circuit 10 as well as one or more supply voltages to the memory 512 and/or the peripherals 514. In some embodiments, more than one instance of the integrated circuit 10 may be included.

The external memory 512 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 514 may include any desired circuitry, depending on the type of system 500. For example, in one embodiment, the system 500 may be a mobile device and the peripherals 514 may include devices for various types of wireless communication, such as WiFi, Bluetooth, cellular, global position system, etc. The peripherals 514 may also include additional storage, including RAM storage, solid-state storage, or disk storage. The peripherals 514 may include user interface devices such as a display screen, including touch display screens or multi-touch display screens, keyboard or other keys, microphones, speakers, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A synchronizer circuit comprising:
    a master stage configured to receive a data input signal and to provide an output on an output line, the master stage includes:
        a first master latch having a first data input coupled to receive the data input signal, and a first clock input coupled to receive a clock signal;
        a second master latch having a second data input coupled to receive the data input signal, and a second clock input coupled to receive a delayed version of the clock signal; and
    a slave stage including a slave latch having an input coupled to the output line of the master stage.

2. The synchronizer circuit as recited in claim 1, further comprising a pull-up circuit configured to drive the output line of the master stage depending upon an output of each of the first master latch and the second master latch.

3. The synchronizer circuit as recited in claim 2, wherein in response to the output of either of the first master latch or the second master latch providing a valid logic level, the pull-up circuit is configured to drive a corresponding signal on the output line of the master stage.

4. The synchronizer circuit as recited in claim 2, wherein the pull-up circuit comprises a transistor stack including a first and a second p-type metal oxide semiconductor (PMOS) transistor and a first and a second n-type metal oxide semiconductor (NMOS) transistor coupled in series between a supply voltage and a circuit ground reference.

5. The synchronizer circuit as recited in claim 4, wherein a gate terminal of the first PMOS transistor and a gate terminal of the first NMOS transistor are both coupled to the output of the first master latch, and a gate terminal of the second PMOS transistor and a gate terminal of the second NMOS transistor are both coupled to the output of the second master latch.

6. The synchronizer circuit as recited in claim 1, further comprising a delay circuit coupled to the second master latch and configured to generate the delayed version of the clock.

7. The synchronizer circuit as recited in claim 1, wherein the input data signal is asynchronous to the clock signal.

8. An integrated circuit comprising:
a circuit; and
a synchronizer circuit coupled to the circuit and configured to receive an input data signal and to provide to the circuit an output data signal that corresponds to the input data signal in response to receiving a clock signal, wherein the synchronizer circuit includes:
a master stage including:
a first master latch having a first data input coupled to receive the input data signal, and a first clock input coupled to receive the clock signal;
a second master latch having a second data input coupled to receive the input data signal, and a second clock input coupled to receive a delayed version of the clock signal; and
a slave stage including a slave latch having an input coupled to the output line of the master stage, wherein the slave stage is configured to provide the output data signal.

9. The integrated circuit as recited in claim 8, further comprising a pull-up circuit configured to drive an output line of the master stage depending upon an output of each of the first master latch and the second master latch.

10. The integrated circuit as recited in claim 9, wherein the pull-up circuit comprises a transistor stack including a plurality of p-type metal oxide semiconductor (PMOS) transistors and a plurality of n-type metal oxide semiconductor (NMOS) transistor coupled in series between a supply voltage and a circuit ground reference.

11. The integrated circuit as recited in claim 10, wherein a gate terminal of a first PMOS transistor and a gate terminal of a first NMOS transistor are both coupled to the output of the first master latch, and a gate terminal of a second PMOS transistor and a gate terminal of a second NMOS transistor are both coupled to the output of the second master latch.

12. The integrated circuit as recited in claim 8, wherein the master stage of the synchronizer circuit further includes a delay circuit coupled to the second master latch and configured to generate the delayed version of the clock having a predetermined delay.

13. The integrated circuit as recited in claim 8, wherein the predetermined delay is dependent upon characteristics of the input data signal.

14. The integrated circuit as recited in claim 8, wherein master stage of the synchronizer circuit further includes a keeper circuit coupled to the output line and configured to retain a value on the output line in response to the output line transitioning to a high impedance state.

15. A synchronizer circuit comprising:
a master stage including:
a plurality of master latches, each having an input coupled to receive an input data signal;
wherein a first latch is coupled to receive a clock signal, and each other remaining latch is coupled to receive a delayed version of the clock signal, wherein each delayed version of the clock signal has a different delay; and
a slave stage including a slave latch having an input coupled to the output line of the master stage.

16. The synchronizer circuit as recited in claim 15, further comprising a pull-up circuit configured to drive an output line of the master stage depending upon an output of each latch of the plurality of master latches.

17. The synchronizer circuit as recited in claim 16, wherein the pull-up circuit comprises a transistor stack including a plurality of p-type metal oxide semiconductor (PMOS) transistors coupled in series with a plurality of n-type metal oxide semiconductor (NMOS) transistors between a supply voltage and a circuit ground reference.

18. The synchronizer circuit as recited in claim 16, wherein the pull-up circuit includes a respective PMOS transistor and a respective NMOS transistor for each latch of the plurality of master latches, wherein a gate terminal of each respective PMOS transistor and each respective NMOS transistor is coupled to the output of each corresponding latch of the plurality of master latches.

19. The synchronizer circuit as recited in claim 15, wherein master stage of the synchronizer circuit further includes a delay circuit coupled to each of the remaining latches and configured to generate each delayed version of the clock signal to have a different predetermined delay.

20. A system comprising:
a first circuit configured to provide a data signal according to a first clock signal;
and a second circuit including a synchronizer circuit configured to receive and sample the data signal according to a second clock signal;
wherein the synchronizer circuit includes:
a master stage including:
a plurality of master latches, each having an input coupled to receive the data signal;
wherein a first latch is coupled to receive the second clock signal, and each other remaining latch is coupled to receive a delayed version of the second clock signal, wherein each delayed version of the second clock signal has a different delay; and
a slave stage including a slave latch having an input coupled to the output line of the master stage.

21. The system as recited in claim 20, wherein the master stage further includes a pull-up circuit configured to drive an output line of the master stage depending upon an output of each latch of the plurality of master latches.

22. The system as recited in claim 21, wherein the pull-up circuit comprises a transistor stack including a plurality of p-type metal oxide semiconductor (PMOS) transistors coupled in series with a plurality of n-type metal oxide semiconductor (NMOS) transistors between a supply voltage and a circuit ground reference.

23. The system as recited in claim 20, wherein master stage of the synchronizer circuit further includes a delay circuit coupled to each of the remaining latches and configured to generate each delayed version of the second clock signal to have a different predetermined delay.

24. The system as recited in claim 23, wherein the predetermined delay is dependent upon characteristics of the data signal.

* * * * *